United States Patent
Yu et al.

(10) Patent No.: US 11,309,357 B2
(45) Date of Patent: Apr. 19, 2022

(54) PIXEL STRUCTURE, MASK AND DISPLAY DEVICE WITH PIXEL ARRANGEMENTS IMPROVING PIXELS PER INCH

(71) Applicant: KUNSHAN GO-VISIONOX OPTO-ELECTRONICS CO., LTD., Kunshan (CN)

(72) Inventors: Jun Yu, Kunshan (CN); Xiaoxu Hu, Kunshan (CN); Xin Ye, Kunshan (CN)

(73) Assignee: KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 594 days.

(21) Appl. No.: 16/330,494

(22) PCT Filed: Jun. 6, 2018

(86) PCT No.: PCT/CN2018/090149
§ 371 (c)(1),
(2) Date: Mar. 5, 2019

(87) PCT Pub. No.: WO2019/041943
PCT Pub. Date: Mar. 7, 2019

(65) Prior Publication Data
US 2021/0384267 A1    Dec. 9, 2021

(30) Foreign Application Priority Data
Aug. 31, 2017   (CN) .......................... 201721111100.7

(51) Int. Cl.
*H01L 29/20*      (2006.01)
*H01L 27/32*      (2006.01)
(Continued)

(52) U.S. Cl.
CPC ........ *H01L 27/3218* (2013.01); *C23C 14/042* (2013.01); *H01L 51/56* (2013.01)

(58) Field of Classification Search
CPC .................................................. H01L 27/3218
See application file for complete search history.

(56) References Cited

U.S. PATENT DOCUMENTS 8,891,044 B2 * 11/2014 Hirota ................. H01L 27/3213
349/106
2009/0179842 A1 * 7/2009 Chen ................. G02F 1/133514
345/88
(Continued)

FOREIGN PATENT DOCUMENTS

CN    102263975 A    11/2011
CN    104036710 A  *  9/2014 ........... G09G 3/2003
(Continued)

OTHER PUBLICATIONS

Japanese Office Action dated Dec. 8, 2020, in connection with corresponding JP Application No. 2019-547083 (10 pp., including machine-generated English translation).
(Continued)

*Primary Examiner* — Caleb E Henry
(74) *Attorney, Agent, or Firm* — Maier & Maier, PLLC

(57) ABSTRACT

The present disclosure provides a pixel structure, a mask and a display device. The pixel structure includes a number of pixel groups arranged in an array. Each of the pixel groups includes a first pixel sub-group and a second pixel sub-group disposed adjacent to each other in a first direction and misaligned with each other in a second direction perpendicular to the first direction. The first pixel sub-group and the second pixel sub-group include sub-pixel groups of three different colors including a first sub-pixel group, a second sub-pixel group, and a third sub-pixel group. Each sub-pixel group includes four sub-pixels of a same color, and the sub-pixel groups of a same color are alternately arranged in a regular manner.

17 Claims, 10 Drawing Sheets

(51) Int. Cl.
*C23C 14/04* (2006.01)
*H01L 51/56* (2006.01)

(56) References Cited

U.S. PATENT DOCUMENTS

| | | | |
|---|---|---|---|
| 2009/0201229 A1* | 8/2009 | Kobayashi | H01L 51/5265 345/76 |
| 2010/0118045 A1* | 5/2010 | Brown Elliott | G09G 3/20 345/589 |
| 2010/0270912 A1 | 10/2010 | Ko | |
| 2014/0197385 A1 | 7/2014 | Madigan | |
| 2014/0246654 A1* | 9/2014 | Huang | H01L 51/504 257/40 |
| 2014/0313242 A1* | 10/2014 | Kaplan | G09G 3/3208 345/694 |
| 2015/0237236 A1* | 8/2015 | Elliott | G06T 5/003 345/600 |
| 2017/0032749 A1* | 2/2017 | Liu | G09G 3/3607 |
| 2017/0194389 A1* | 7/2017 | Guo | H01L 27/3218 |
| 2018/0239157 A1 | 8/2018 | Chen et al. | |

FOREIGN PATENT DOCUMENTS

| | | | | |
|---|---|---|---|---|
| CN | 104050896 A | * | 9/2014 | G09G 3/20 |
| CN | 104103672 A | * | 10/2014 | H01L 27/3209 |
| CN | 104319283 A | | 1/2015 | |
| CN | 104600096 A | | 5/2015 | |
| CN | 105242436 A | | 1/2016 | |
| CN | 105425405 A | | 3/2016 | |
| CN | 106297642 A | | 1/2017 | |
| CN | 106449725 A | | 2/2017 | |
| CN | 207320118 U | | 5/2018 | |
| EP | 1 544 928 A2 | | 6/2005 | |
| GB | 2 437 110 A | | 10/2007 | |
| JP | 2009169070 A | | 7/2009 | |
| JP | 2009-533810 A | | 9/2009 | |
| JP | 2012-088587 A | | 5/2012 | |
| JP | 2013125115 A | | 6/2013 | |
| JP | 2015146003 A | | 8/2015 | |
| JP | 2016-507131 A | | 3/2016 | |
| JP | 2016035561 A | | 3/2016 | |
| JP | 2016090991 A | | 5/2016 | |
| KR | 10-2010-0071725 A | | 6/2010 | |
| KR | 10-2016-0067086 A | | 6/2016 | |

OTHER PUBLICATIONS

Japanese Office Action dated Jun. 29, 2021, in connection with corresponding JP Application No. 2019-547083 (6 pp., including machine-generated English translation).

Extended European Search Report dated Aug. 5, 2020, including the Supplementary European Search Report and the European Search Opinion, in connection with corresponding EP Application No. 18850266.0 (8 pp.).

Japanese Office Action dated Sep. 1, 2020, in connection with corresponding JP Application No. 2019-547083 (6 pp., including machine-generated English translation).

Korean Office Action dated Aug. 10, 2020, in connection with corresponding KR Application No. 10-2019-7026161 (10 pp., including machine-generated English translation).

International Search Report dated Aug. 30, 2018 in corresponding International application No. PCT/CN2018/090149; 3 pages.

Korean Office Action dated Aug. 30, 2021, in connection with KR Application No. 10-2019-7026161 (6 pp., including machine-generated English translation).

* cited by examiner

PIXEL STRUCTURE, MASK AND DISPLAY DEVICE WITH PIXEL ARRANGEMENTS IMPROVING PIXELS PER INCH

CROSS-REFERENCE TO RELATED APPLICATION

The application claims the benefit of priority of Chinese Patent Application No. 201721111100.7, filed on Aug. 31, 2017, and the entire disclosures of which are incorporated herein.

TECHNICAL FIELD

The present disclosure relates to the field of display technologies, and in particular, to a pixel structure, a mask and a display device.

BACKGROUND

The Organic Light-Emitting Diode (OLED) display technology has a self-illuminating characteristic, and has advantages of a large viewing angle of a display screen and energy saving, thus being widely applied in a product such as mobile phone, digital video camera, DVD player, Personal Digital Assistant (PDA), notebook computer, car stereo, television and so on.

At present, a side-by-side arrangement of a pixel is used in a typical pixel structure of an OLED display panel. In the side-by-side method, there are Red, Green, and Blue (R, G, B) sub-pixels in the range of one Pixel. Each sub-pixel is rectangular, and has an independent organic light-emitting component. Specifically, as shown in FIG. 1A, each pixel unit includes an R (red) sub-pixel 101, a G (green) sub-pixel 103, and a B (blue) sub-pixel 105, arranged in a straight line. The R, G, B sub-pixels are all rectangular, all sub-pixels are equal in size, and the ratio of the numbers of the R, G, B sub-pixels is 1:1:1. Such pixel structure is generally called Real RGB in industry.

The pixel structure shown in FIG. 1A is generally achieved by evaporation using a Fine Metal Mask (FMM) as shown in FIG. 1B. The FMM includes a shielding region 107 and a plurality of evaporation openings 108. The shielding region between adjacent two evaporation openings 108 in a same row is called a bridge. The FMM generally has a limitation of a minimum opening. The sub-pixels of different colors in the evaporation process have a spacing limitation between the openings. The preparation of the OLED pixel structure is inevitably limited by the FMM opening and the precision of the evaporation process. In the pixel structure shown in FIG. 1A, when the Pixel Per Inch (PPI) is higher than 300 PPI, the present FMM process is difficult to achieve, thus failing to meet the development requirements of a high PPI of an OLED display device.

SUMMARY

The inventors have found through researches that the traditional RGB pixel structure cannot meet the requirements of a high PPI display effect of a product. Based on this, it is an object of the present disclosure to provide a pixel structure, a mask and a display device, which can achieve the high PPI.

To solve the foregoing technical problem, the present disclosure provides a pixel structure. The pixel structure comprises a plurality of pixel groups arranged in an array, wherein each of the pixel groups comprises a first pixel sub-group and a second pixel sub-group disposed adjacent to each other and misaligned with each other, each of the first pixel sub-group and the second pixel sub-group comprises sub-pixel groups of three different colors, i.e., a first sub-pixel group, a second sub-pixel group, and a third sub-pixel group, and each of the sub-pixel groups comprises four sub-pixels of a same color.

Optionally, in each of the pixel groups, the first pixel sub-group and the second pixel sub-group are disposed adjacent to each other in the first direction and are misaligned with each other in the second direction perpendicular to the first direction.

Optionally, the first direction is the row direction, and the second direction is the column direction; or the first direction is the column direction, and the second direction is the row direction.

Optionally, in each of the pixel groups and in each of the first pixel sub-group and the second pixel sub-group, sub-pixel groups of three different colors are repeatedly arranged in the second direction in a same order.

Optionally, in each of the pixel groups and in each of the first pixel sub-group and the second pixel sub-group, sub-pixel groups of three different colors are repeatedly arranged in the second direction in a different order.

Optionally, four sub-pixels of a same color in each sub-pixel group are arranged in an array of two rows and two columns in the first direction and the second direction.

Optionally, the three colors are red, green and blue.

Optionally, in each of the pixel groups, a shape and size of each sub-pixel are same.

Optionally, each sub-pixel is of a strip-shape.

Optionally, four sub-pixels of a same color in each sub-pixel group have a same shape and size, and wherein in a same pixel group, the center line of a sub-pixel group of a first color in the second pixel sub-group along the second direction coincides with the boundary line between a sub-pixel group of a second color in the first pixel sub-group and a sub-pixel group of a third color in the first pixel sub-group when the height of the second pixel sub-group in the second direction is lower than the height of the first pixel sub-group in the second direction.

Four sub-pixels of a same color in each sub-pixel group have a same shape and size, and wherein in a same pixel group, the center line of a sub-pixel group of a first color of the first pixel sub-group along the second direction coincides with the boundary line between a sub-pixel group of a second color in the second pixel sub-group and a sub-pixel group of a third color in the second pixel sub-group when the height of the second pixel sub-group in the second direction is higher than the height of the first pixel sub-group in the second direction.

Optionally, each of the pixel groups is divided into at least one pixel unit, and each pixel unit comprises sub-pixels of three different colors.

Optionally, in a same pixel group, no sub-pixel is shared between the first sub-pixel sub-group and the second sub-pixel sub-group is shared.

Optionally, in a same pixel group, at least one sub-pixel in the first sub-pixel sub-group and/or the second sub-pixel sub-group is shared to form a corresponding pixel unit.

Optionally, in the formed pixel unit, some of the pixel unit is used for achieving left eye display, and the other of the pixel unit is used for achieving right eye display.

The present disclosure also provides a mask for manufacturing any of the above pixel structures.

Optionally, evaporation openings of the mask are arranged in a staggered manner.

Optionally, one evaporation opening of the mask corresponds to at least two sub-pixels of a same color. The present disclosure also provides a display device, comprising any of the above pixel structures.

Compared to the prior art, the technical solution of the present disclosure has the following advantageous effects:

1. the pixel structure comprises a plurality of pixel groups arranged in an array, each of the pixel groups comprising the first pixel sub-group and the second pixel sub-group, which are disposed adjacent to each other in the first direction and each comprise sub-pixel groups of three different colors; the first pixel sub-group and the second pixel sub-group are misaligned with each other; each sub-pixel group comprises four sub-pixels of a same color, and an evaporation opening of the mask corresponds to at least two sub-pixels of a same color, thus ensuring regularly alternating arrangement of the sub-pixel groups of a same color, enabling the increase of the strength of the mask, reducing the difficulties of the preparation process of the evaporation mask and the evaporation process, facilitating the preparation of small-sized sub-pixels and improving the PPI of the display device;

2. three colors are relatively uniformly distributed in the pixel structure, thereby resulting in a better display effect; each sub-pixel group comprises four sub-pixels of a same color, and the corresponding pixel units can be divided according to different display requirements, so that each pixel unit comprises sub-pixels of three different colors and panchromatic display in true sense is able to be achieved by adjusting the display scales of red, green, and blue to achieve different gray-scale and color combinations when the three colors are three primary colors, i.e., red, green, and blue, thus having a wide range of disclosure.

DETAILED DESCRIPTION OF THE INVENTION

Figure 1A:
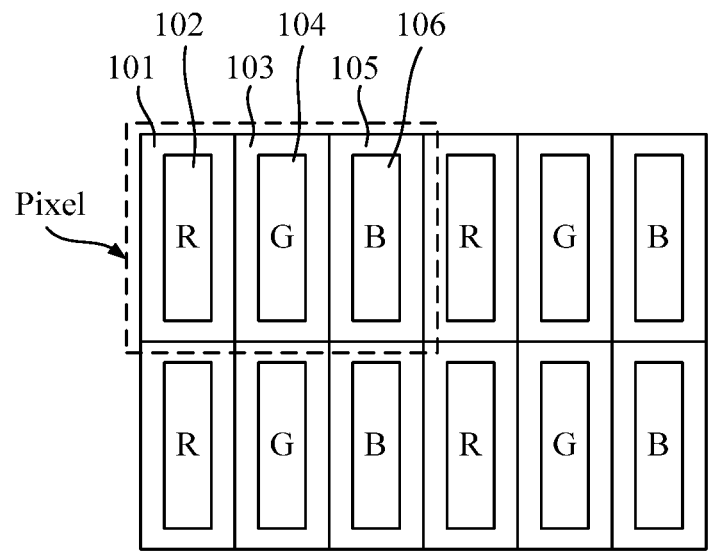
FIG. 1A is an arrangement schematic diagram of a pixel structure of an OLED display panel in the prior art.
Figure 1B:
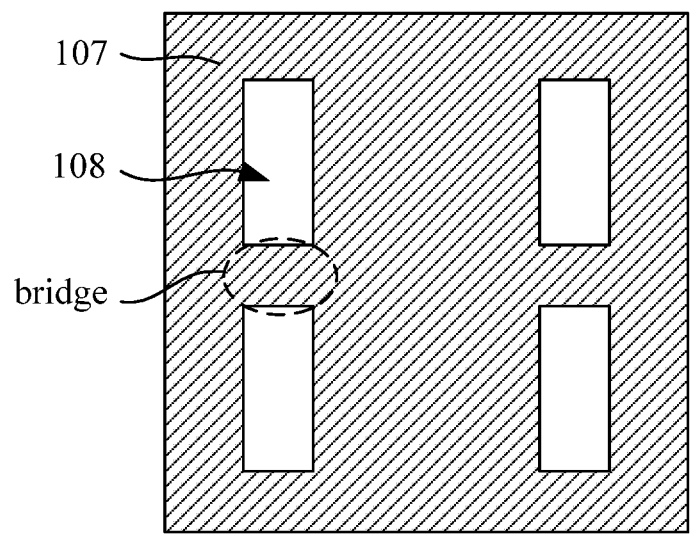
FIG. 1B is a schematic diagram of an FMM corresponding to FIG. 1A.

The present disclosure will be described below with reference to the accompanying drawings. It should be noted that the drawings are presented in a very simplified form not necessarily presented to scale, with the only purpose of facilitating convenience and clarity in explaining the embodiments of the present disclosure, and only a part of the corresponding structures is shown in each drawing. An actual product can be correspondingly changed according to actual display needs. In addition, a first row, a second row, a first column, a second column described in the present disclosure are all reference standards as illustrated in the drawings for describing the present disclosure, rather than indicating the rows and columns in the actual product.

Figure 2A:
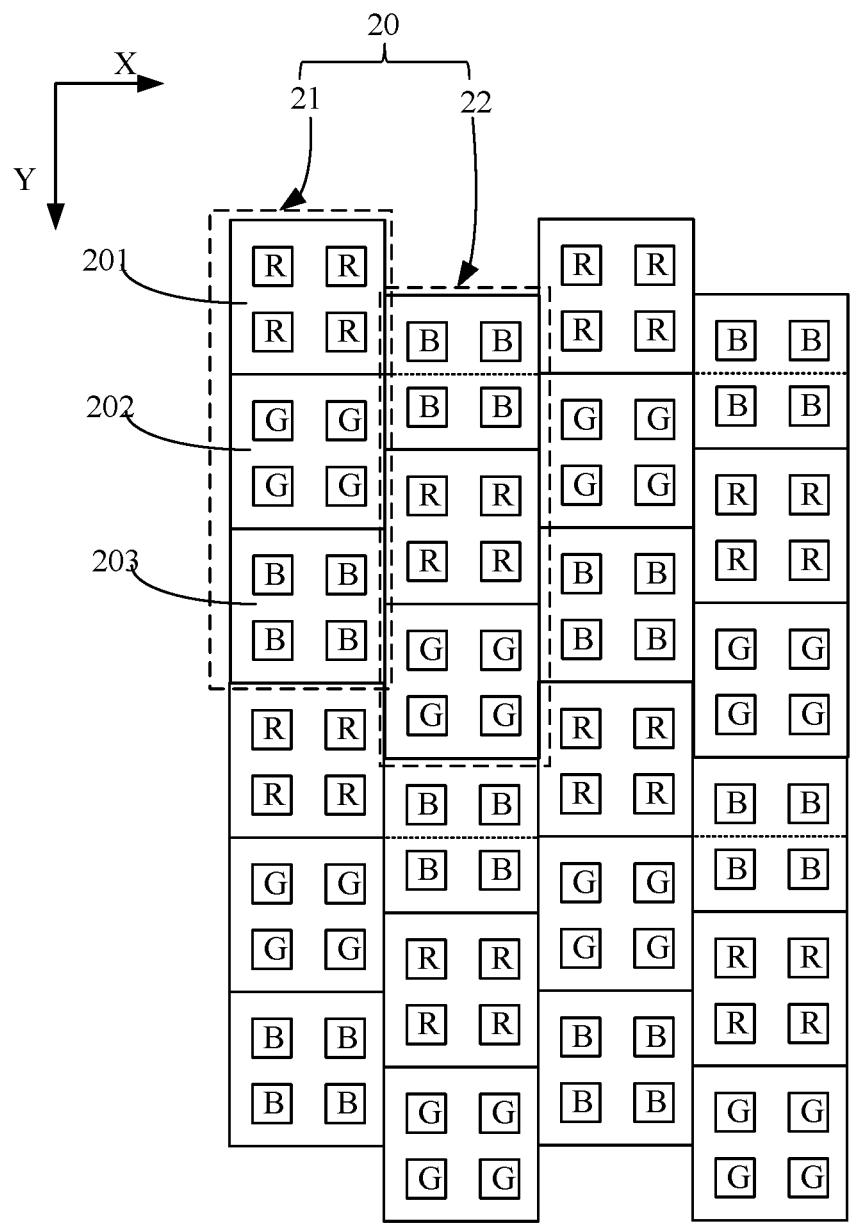
FIG. 2A is an arrangement schematic diagram of pixel structure according to specific embodiments of the present disclosure.
Figure 2B:
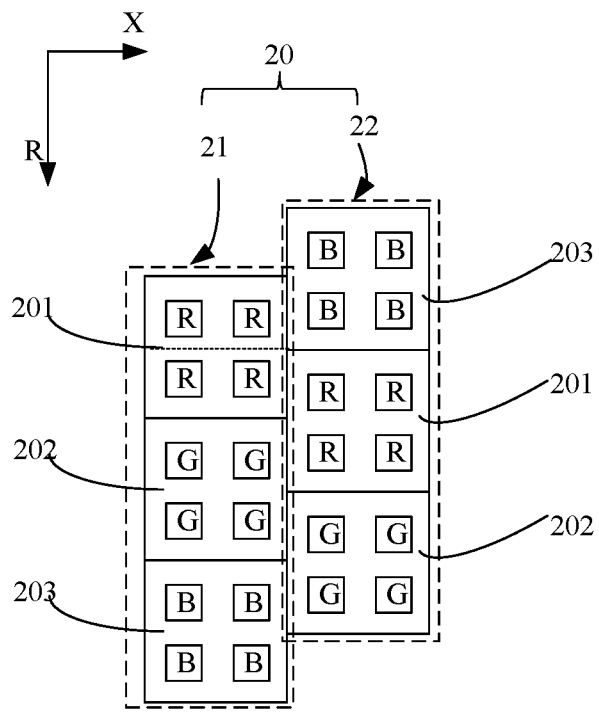
FIG. 2B is another arrangement schematic diagram of pixel structure according to specific embodiments of the present disclosure.

Referring to FIG. 2A to FIG. 2G, an embodiment of the present disclosure provides a pixel structure, including a plurality of pixel groups 20 arranged in an array. Each of the pixel groups 20 includes a first pixel sub-group 21 and a second pixel sub-group 22 disposed adjacent to each other (i.e., arranged in columns) in a X direction (a first direction) and misaligned with each other in a Y direction (a second direction). A misalignment of the first pixel sub-group 21 and the second pixel sub-group 22 in the Y direction refers to that the tops of the first pixel sub-group 21 and the second pixel sub-group 22 in the Y direction are not in a same height. For example, the height of the first pixel sub-group 21 in the Y direction is higher than the height of the second pixel sub-group 22 in the Y direction, so that the second pixel sub-group 22 is misaligned downward with respect to the first pixel sub-group 21, as shown in FIG. 2A. For another example, the height of the first pixel sub-group 21 in the Y direction is lower than the height of the second pixel sub-group 22 in the Y direction, so that the second pixel sub-group 22 is misaligned upward with respect to the first pixel sub-group 21, as shown in FIG. 2B. The pixel structure of this embodiment substantially includes a plurality of pixel group columns formed by the first pixel sub-groups 21 arranged in the Y direction and a plurality of pixel group columns formed by the second pixel sub-groups 22 arranged in the Y direction. The pixel group columns formed by the first pixel sub-groups 21 in the Y direction and the pixel group columns formed by the second pixel sub-groups 22 in the Y direction are alternately and repeatedly arranged in the X direction, and adjacent two pixel group columns are misaligned with each other. In other words, the sub-pixels in all odd-numbered pixel group columns are arranged in a same manner, and the sub-pixels in even-numbered pixel group columns are also arranged in a same manner. However, the sub-pixel groups of a same color in the odd-numbered pixel group columns and the even-numbered pixel group columns are not vertically aligned, but are staggered (shifted) from each other.

The first pixel sub-group 21 and the second pixel sub-group 22 each comprises sub-pixel groups of three different colors, i.e., a first sub-pixel group 201, a second sub-pixel group 202, and a third sub-pixel group 203. The three colors may be red (R), green (G), and blue (B). Moreover, in the first pixel sub-group 21 and the second pixel sub-group 22, the arrangement order of the first sub-pixel group 201, the second sub-pixel group 202, and the third sub-pixel group 203 may be the same (as shown in FIG. 2G) or different (as shown in FIG. 2A to FIG. 2F and FIG. 2H). Each sub-pixel group includes four sub-pixels of a same color, and the four sub-pixels are identical in shape and size and are arranged in an array of two rows and two columns. For example, the four sub-pixels in the first sub-pixel group 201 are all red sub-pixels, denoted as R; the four sub-pixels in the second sub-pixel group 202 are all green sub-pixels, denoted as G; and the four sub-pixels in the third sub-pixel group 203 are all blue sub-pixels, denoted as B, and the four R, four G, and four B are each arranged in a 2×2 array.

Figure 2C:
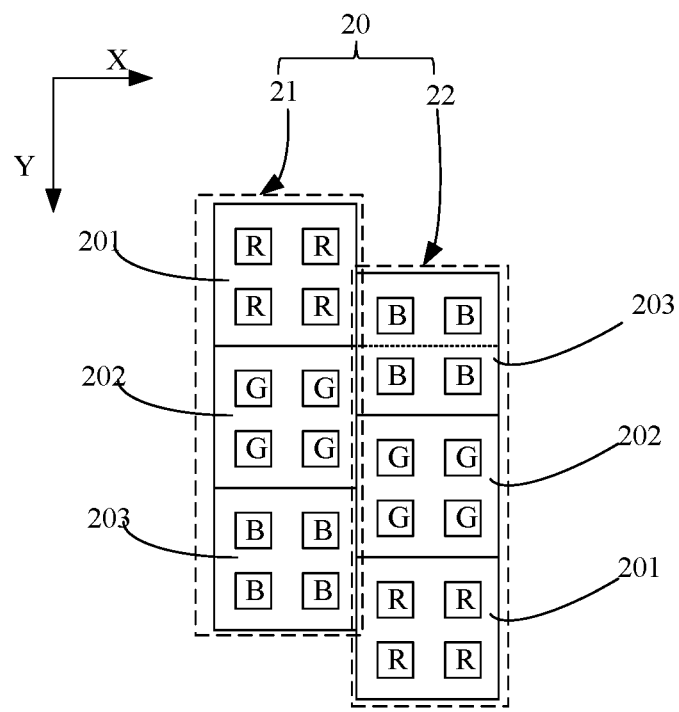
FIG. 2C is another arrangement schematic diagram of pixel structure according to specific embodiments of the present disclosure.
Figure 2D:
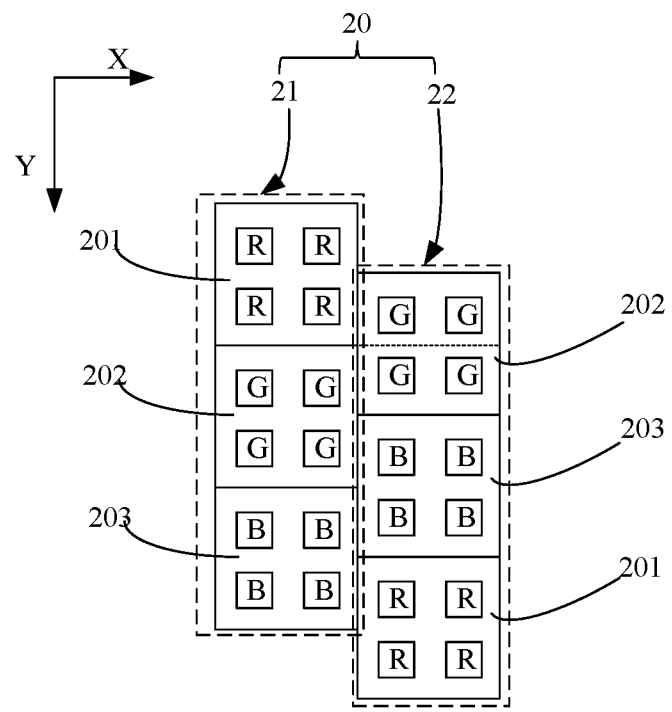
FIG. 2D is another arrangement schematic diagram of pixel structure according to specific embodiments of the present disclosure.
Figure 2E:
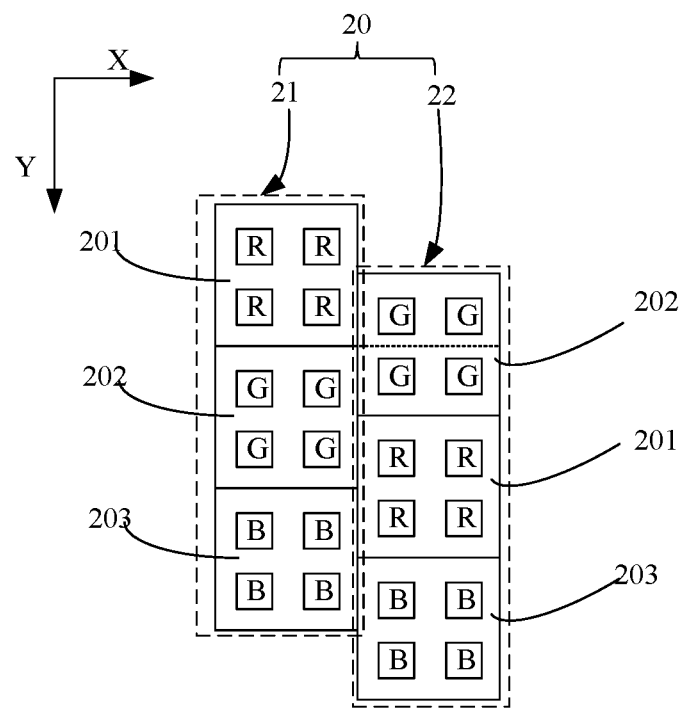
FIG. 2E is another arrangement schematic diagram of pixel structure according to specific embodiments of the present disclosure.
Figure 2F:
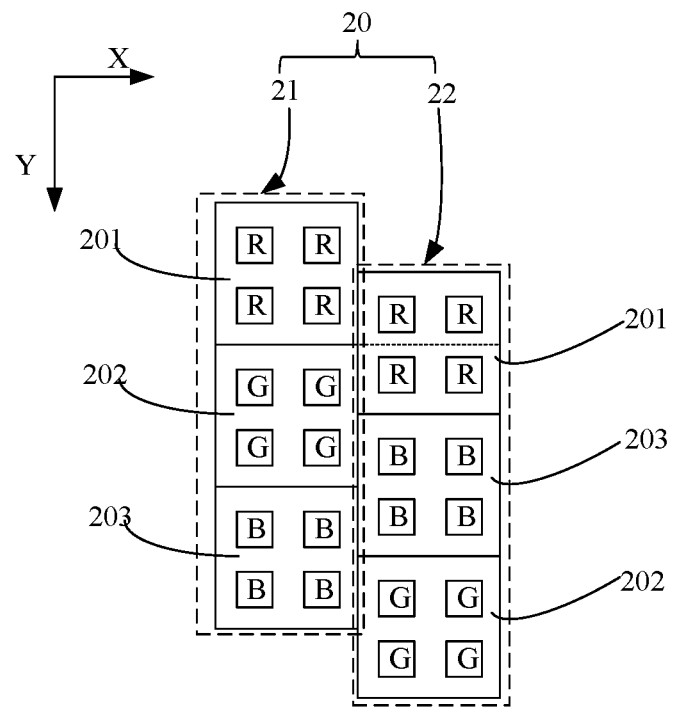
FIG. 2F is another arrangement schematic diagram of pixel structure according to specific embodiments of the present disclosure.
Figure 2G:
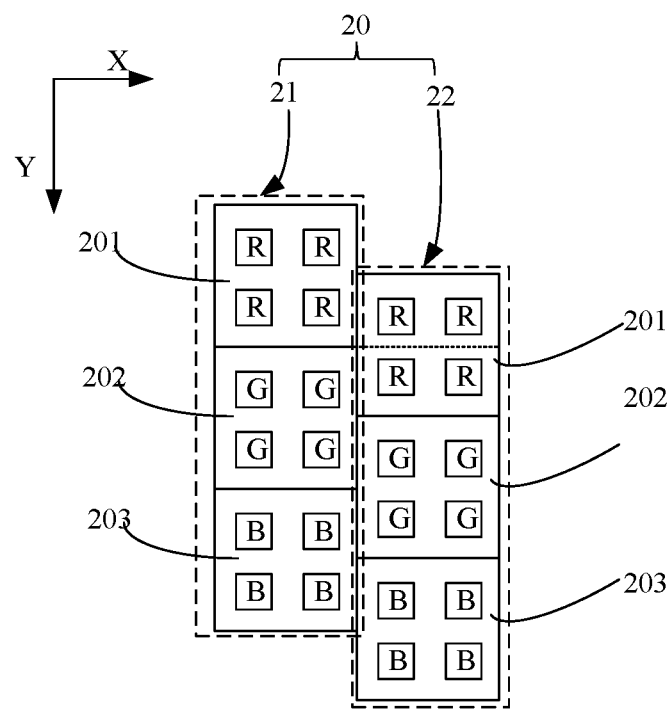
FIG. 2G is another arrangement schematic diagram of pixel structure according to specific embodiments of the present disclosure.
Figure 2H:
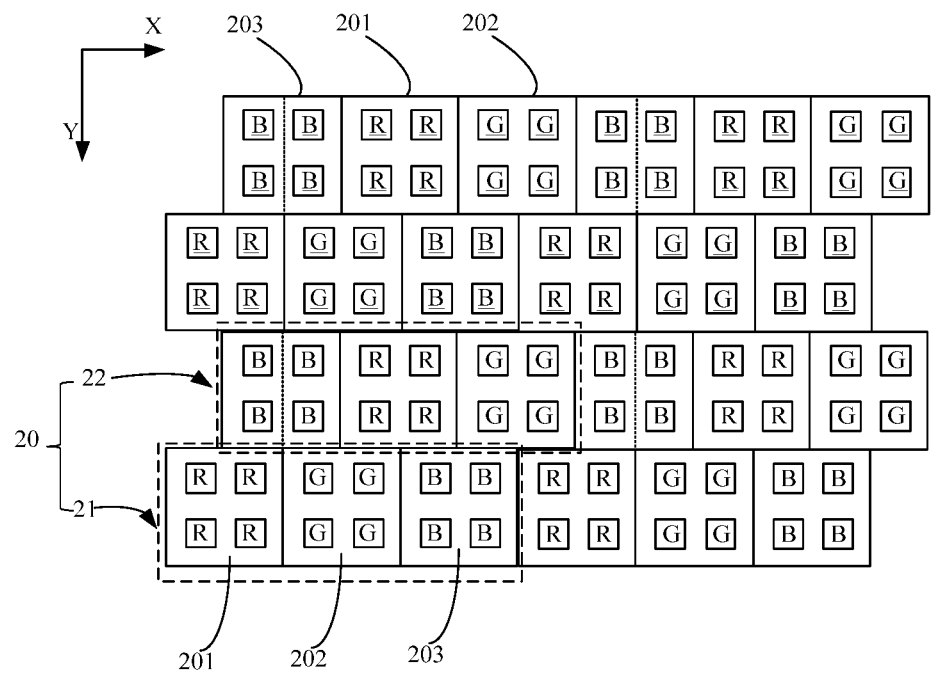
FIG. 2H is another arrangement schematic diagram of pixel structure according to specific embodiments of the present disclosure.

Referring to FIG. 2A to FIG. 2H, in the first pixel sub-group 21, the arrangement order of the sub-pixel groups of three different colors in the Y direction (the X direction in FIG. 2H) may be the first sub-pixel group 201, the second sub-pixel group 202, and the third sub-pixel group 203. Accordingly, along the Y direction, the arrangement order of the sub-pixel groups of three different colors in the second pixel sub-group 22 may be the third sub-pixel group 203, the first sub-pixel group 201, and the second sub-pixel group 202, as shown in FIG. 2A, FIG. 2B and FIG. 2H; may also be the third sub-pixel group 203, the second sub-pixel group 202, and the first sub-pixel group 201, as shown in FIG. 2C; may also be the second sub-pixel group 202, the third sub-pixel group 203, and the first sub-pixel group 201, as shown in FIG. 2D; may also be the second sub-pixel group 202, the first sub-pixel group 201, and the third sub-pixel group 203, as shown in FIG. 2E; may also be the first sub-pixel group 201, the third sub-pixel group 203, and the second sub-pixel group 202, as shown in FIG. 2F; and may also be the first sub-pixel group 201, the second sub-pixel group 202, and the third sub-pixel group 203, as shown in FIG. 2G.

Optionally, referring to FIG. 2A, in each pixel group 20, when the first pixel sub-group 21 is misaligned upward with respect to the second pixel sub-group 22, the center line (e.g., the dotted line between two rows of B in FIG. 2A) of the sub-pixel group of a first color of the second pixel sub-group 22 in the Y direction coincides with the boundary line (e.g., the solid line between four R and four G in FIG. 2A) between the sub-pixel groups of another two colors of the first pixel sub-group 21. Referring to FIG. 2B, in each pixel group 20, when the first pixel sub-group 21 is misaligned downward with respect to the second pixel sub-group 22, the center line (e.g., the dotted line between two rows of R in FIG. 2B) of the sub-pixel group of the first color of the first pixel sub-group 21 in the Y direction coincides with the boundary line (e.g., the solid line between four B and four R in FIG. 2B) between the sub-pixel groups of another two colors in the second pixel sub-group 22. Therefore, the misalignment of the first pixel sub-group 21 with respect to the second pixel sub-group 22 is achieved, facilitating the division of a pixel including the sub-pixels in the first pixel sub-group 21 and the sub-pixels in the second pixel sub-group 22, thus achieving a high PPI. In addition, it is also beneficial to reduce the difficulty of manufacturing a mask.

It should be noted that the sizes of the sub-pixels having various colors can be adaptively adjusted according to the lifespan of each sub-pixel. Preferably, in a same pixel group, the shapes and sizes of all the sub-pixels are same, so that a same mask can be used to evaporate sub-pixels of three colors in three times to minimize the cost; or, the shapes and sizes of the sub-pixels of two colors are same, and the shapes and sizes of the sub-pixels of another color are different from that of the sub-pixels of two colors, so that the same mask can be used to evaporate the sub-pixels of the two colors in two times to save the cost; or, the shapes of the sub-pixels of three colors is same, and the size of the sub-pixels of three colors is not exactly same. For example, in a same pixel group, the shapes of the sub-pixels R, G, and B are all strips, and the strip may be a right-angled rectangle, a rounded rectangle, and a notched rectangle (at least one of the four rectangular corners is not a right angle and a rounded corner). A length-width ratio of the rectangle corresponding to the strip may be 1:1, 2:1, 3:1, 3:2 or 4:3 to facilitate optimization of a wiring space. The sizes of the sub-pixels R and B are identical, and the size of the sub-pixel G (e.g., the width of the rectangle) is larger or smaller than the size of the sub-pixel R (e.g., the width of the rectangle).

In addition, it can be understood that, in an actual manufacturing, a certain deviation is allowed between the actual shapes (and sizes) of various products and the designed shapes (and sizes) of various products. In general, as long as the actual shape (and size) of the product is within the allowable deviation range of the designed shape (and size) of the product, the requirements of use can be met. For example, the shapes of the sub-pixel G, the sub-pixel R, and the sub-pixel B may also be rectangle-like shapes, such as an approximately rectangular or approximately square trapezoid. The trapezoid may be an isosceles trapezoid or a non-isosceles trapezoid, and may be a regular trapezoid, an inverted trapezoid, a trapezoid counterclockwise rotated by 90 degrees or a trapezoid clockwise rotated by 90 degrees. In a preferred embodiment, the trapezoid is an isosceles trapezoid, the difference in size between the upper base and the lower base of the isosceles trapezoid being less than 10% of the length of the lower base, an included angle of the waist and the upper side of the isosceles trapezoid being greater than 90 degrees and less than 100 degrees, an included angle of the waist and the lower base of the isosceles trapezoid being greater than 80 degrees and less than 90 degrees. In this way, the shapes of the sub-pixel G, the sub-pixel R and the sub-pixel B are approximately square (within the allowable deviation range), and thus a better arrangement effect can stilled be obtained.

In addition, depending on actual design and production requirements, the pixel structure formed by arranging the pixel groups in FIG. 2A to FIG. 2G in an array may be counterclockwise or clockwise rotated by 90 degrees, and certainly, may also be rotated by 180 degrees. For example, a pixel structure as shown in FIG. 2H can be obtained by counterclockwise rotating FIG. 2A by 90 degrees. As shown in FIG. 2H, the pixel structure includes a plurality of pixel groups 20 arranged in an array. Each pixel group 20 includes a first pixel sub-group 21 and a second pixel sub-group 22, which are disposed adjacent to each other in the Y direction (i.e., arranged by rows) and respectively include sub-pixel groups of three different colors of R, G and B, wherein the first pixel sub-group 21 may include a first sub-pixel group 201, a second sub-pixel group 202, and a third sub-pixel group 203 sequentially arranged in the X direction; the second pixel sub-group 22 may include a third sub-pixel group 203, a first sub-pixel group 201, and a second sub-pixel group 202 sequentially arranged in the X direction. Each sub-pixel group includes four sub-pixels of a same color and arranged in a 2×2 array, that is, the sub-pixels in the first pixel sub-group 21 are arranged in an array of two rows and six columns (RR GG BB/RR GG BB). The position of the sub-pixel group of three colors in the second pixel sub-group 22 is different from that of the first pixel sub-group 21, but is also an array of two rows and six columns (BB RR GG/BB RR GG). In each pixel group 20, the second pixel sub-group 22 is misaligned rightward with respect to the first pixel sub-group 21, and the center line of a gap between a first column of sub-pixels (BB) and a second column of sub-pixels (BB) of the second pixel sub-group 22 in the Y direction coincides with the center line of a gap between a second column of sub-pixels (RR) and a third column of sub-pixels (GG) of the first pixel sub-group 21 in the X direction. The pixel structure substantially includes a plurality of pixel group rows formed by the first pixel sub-groups 21 sequentially arranged in the X direction and a plurality of pixel group rows formed by the second pixel sub-groups 22 sequentially arranged in the X direction. The pixel group rows formed by the first pixel sub-groups 21 in the X direction and the pixel group rows formed by the second pixel sub-groups 22 in the X direction are alternately and repeatedly arranged in the Y direction, and adjacent two pixel group rows are misaligned with each other. In other words, the sub-pixels in all the odd-numbered pixel group rows are arranged in a same manner, and the sub-pixels in the even-numbered pixel group rows are also arranged in a same manner. However, the sub-pixel groups of a same color in the odd-numbered pixel group rows and the even-numbered pixel group rows are not vertically aligned, but are staggered (shifted) from each other.

In the pixel structure of each embodiment of the present disclosure, each sub-pixel (R/G/B) includes a light-emitting region (a display region) and a non-light-emitting region (a non-display region). The light-emitting region of each sub-pixel includes a cathode, an anode, and an electroluminescent layer (also called an organic light-emitting layer), and the electroluminescent layer is located between the cathode and the anode and configured to generate light of a predetermined color to achieve display. Generally, in the pixel structure of the present disclosure, the evaporation process is performed three times to form electroluminescent layers of corresponding colors (e.g., red, green, or blue) in the light-emitting regions of the corresponding sub-pixels, respectively.

Figure 3:
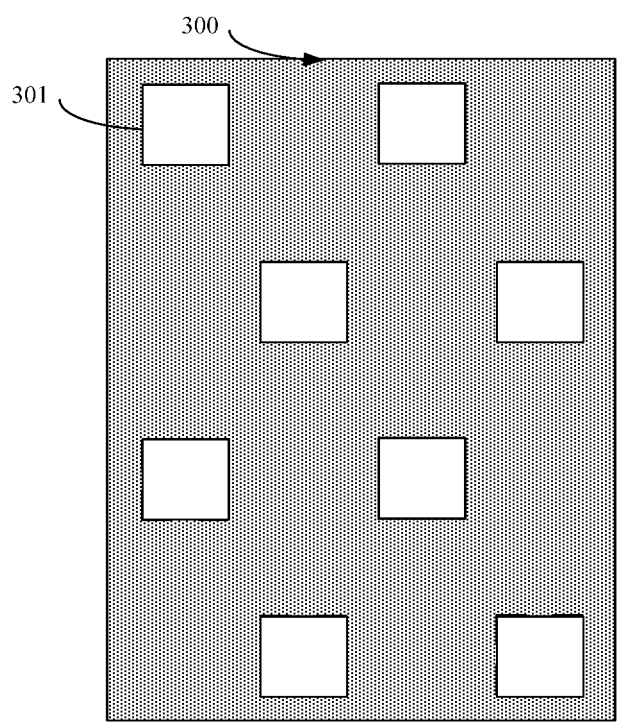
FIG. 3 is a schematic diagram of an FMM according to specific embodiments of the present disclosure.

FIG. 3 is a schematic diagram of an FMM used to evaporate the sub-pixels of a certain color, corresponding to the pixel structure shown in FIG. 2A. As shown in FIG. 3, the mask has a plurality of evaporation openings 301. Each evaporation opening 301 corresponds to at least two sub-pixels of a same color. For example, each evaporation opening 301 corresponds to four sub-pixels (i.e., a sub-pixel group of the first pixel sub-group 21 or the second pixel sub-group 22) of a same color at the corresponding positions in FIG. 2A. Since the sub-pixel groups of a same color in the odd-numbered pixel group columns and the even-numbered pixel group columns in FIG. 2A are not vertically aligned and are staggered (shifted) from each other, the evaporation openings 301 on the evaporation mask (e.g., the FMM) used to form sub-pixel groups of a same color are also staggered. Thus, the strength of the FMM is able to be increased, the problems such as warping and fracture of the FMM are able to be avoided as much as possible, and the defects affecting the evaporation quality such as dizzy and offset of the evaporation film are able to be reduced. The sub-pixel groups of three colors are arranged in a same manner when all sub-pixels have the same shapes and sizes, resulting in the sub-pixels of three colors being able to be evaporated by a shared mask in an offset manner to save cost. Four sub-pixels in each sub-pixel group may share an evaporation opening 301, thereby reducing space occupation. The aperture ratio may be increased to improve the PPI, or the existing openings are made larger without increasing the opening to facilitate reduction of the process difficulty. It should be noted that all sub-pixel groups of a same color may be formed by corresponding offsets and evaporation more than once when one evaporation opening 301 of the mask corresponds to two sub-pixels of a same color.

The pixel structure of the present disclosure is arranged in an array in units of "pixel group 20", and the adjacent first pixel sub-group 21 and second pixel sub-group 22 therein are misaligned with each other, resulting in the structure thereof being greatly changed with respect to the conventional pixel structure as shown in FIG. 1A. Therefore, the division of the pixels (or a display driving method) is also changed, and each of the divided pixels includes sub-pixels of three colors, to achieve panchromatic display. The pixel structure of the present disclosure is able to be used for 2D flat panel display, and is further able to be used for 3D (stereoscopic or three-dimensional) display by means of time-sharing control. Specific division manners of the pixel unit for the pixel structure of the present disclosure will be described in detail below by taking the pixel structure shown in FIG. 2A as an example.

Figure 4A:
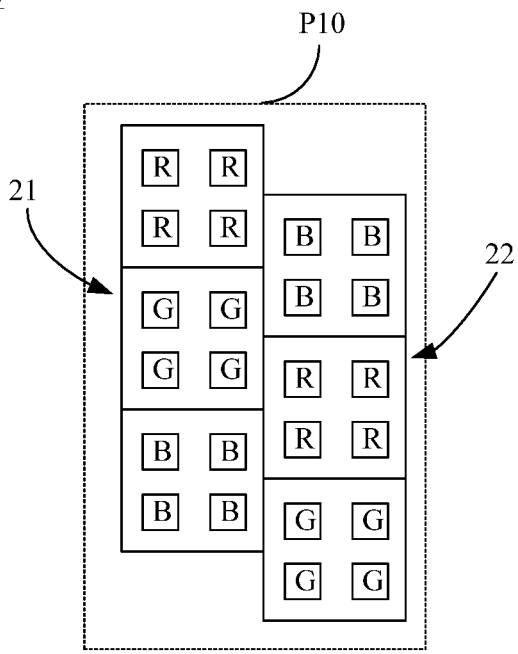
FIG. 4A is a schematic diagram showing a division of pixel units according to specific embodiments of the present disclosure.

Referring to FIG. 4A, in an embodiment of the present disclosure, each pixel group 20 may be divided into a pixel unit P10, that is, each pixel unit P10 includes a first pixel sub-group 21 and a second pixel sub-group 22. That is to say, each pixel unit P10 includes eight R sub-pixels, eight B sub-pixels, and eight G sub-pixels. In such a division manner of pixel units, each pixel unit includes sub-pixels having three colors of R, G, and B, enabling the achievement of a panchromatic display, being able to be used in the 2D display mode and having a better display effect due to a larger number of the sub-pixels.

Figure 4B:
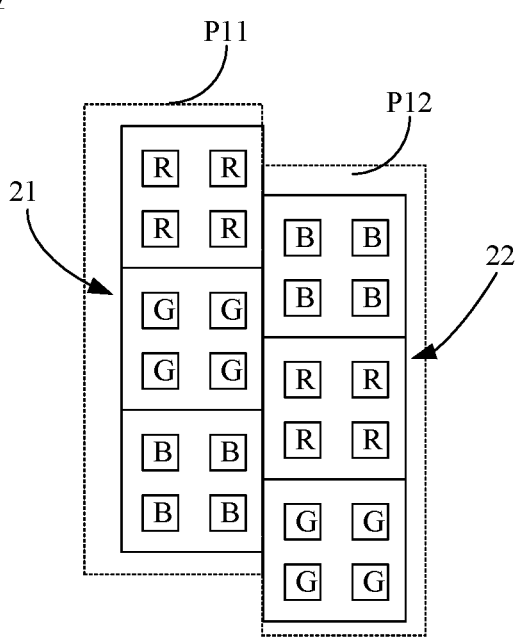
FIG. 4B is another schematic diagram showing a division of pixel units according to specific embodiments of the present disclosure.

Referring to FIG. 4B, in an embodiment of the present disclosure, each pixel group 20 may be divided into two pixel units. The first pixel sub-group 21 is a pixel unit P11, and the second pixel sub-group 22 is a pixel unit P12. Each pixel unit includes four R sub-pixels, four B sub-pixels, and four G sub-pixels, enabling the achievement of the panchromatic display, being able to be used in the 2D display mode. Since the number of pixel units is twice the number of pixel units shown in FIG. 4A, the display effect is further improved. In addition, the pixel units P11 and P12 are also able to be controlled for time-sharing display, so that the pixel units like P11 (i.e., the pixel units formed by the first pixel sub-group 21) separated from the pixel structure are able to be used for left eye display, and the pixel units like P12 (i.e., the pixel units formed by the second pixel sub-group 22) separated from the pixel structure are able to be used for right eye display, thereby enabling the pixel structure to be applied to VR and 3D display technologies.

Figure 4C:
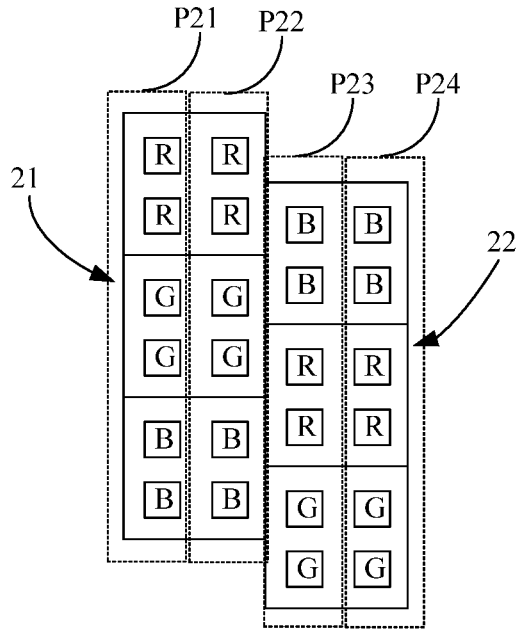
FIG. 4C is another schematic diagram showing a division of pixel units according to specific embodiments of the present disclosure.

Referring to FIG. 4C, in an embodiment of the present disclosure, each pixel group 20 may be divided into four pixel units. Two columns of sub-pixels of the first pixel sub-group 21 are each divided into pixel units P21 and P22, and two columns of sub-pixels of the second pixel sub-group 22 are each divided into pixel units P23 and P24. Each pixel unit includes two R sub-pixels, two B sub-pixels and two G sub-pixels, enabling the achievement of the panchromatic display, and being able to be used in 2D display mode. Moreover, since the number of pixel units is twice the number of pixel units shown in FIG. 4B, the display effect is further improved. In addition, the pixel units P21 to P24 are also able to be controlled for time-sharing display, so that pixel units like P21 and P23 (i.e., the pixel units including the left column of the sub-pixels of each pixel sub-group) separated from the pixel structure are able to be used for left eye display, and pixel units like P22 and P24 (i.e., the pixel units including the right column of sub-pixels of each pixel sub-group) separated from the pixel structure are able to be used for right eye display, thereby enabling the pixel structure to be applied to the VR and 3D display technologies.

In an embodiment of the present disclosure, a part of the sub-pixels of the first pixel sub-group 21 and a part of the sub-pixels of the second pixel sub-group 22 in each pixel group 20 may be divided into a pixel unit.

Figure 4D:
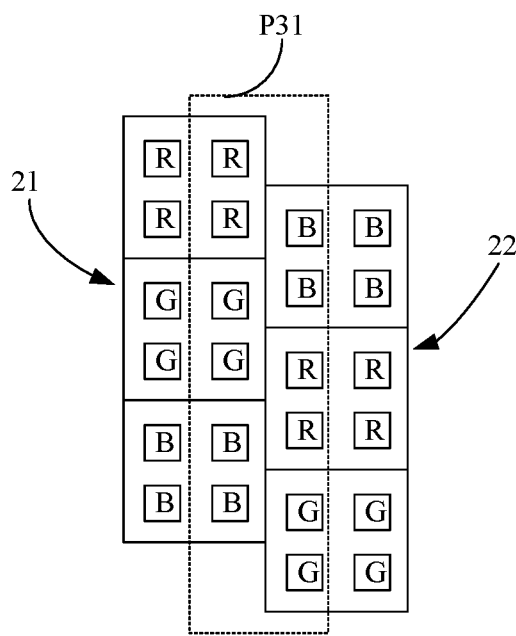
FIG. 4D is another schematic diagram showing a division of pixel units according to specific embodiments of the present disclosure.

For example, please refer to FIG. 4D, in each pixel group 20, adjacent two columns of sub-pixels in the first pixel sub-group 21 and the second pixel sub-group 22 may be divided into a pixel unit P31. Each pixel unit 31 includes four R sub-pixels, four B sub-pixels, and four G sub-pixels, enabling the achievement of the panchromatic display and being able to be used in the 2D display mode. Moreover, since the number of pixel units is twice the number of pixel units shown in FIG. 4A, the display effect is further improved.

Figure 4E:
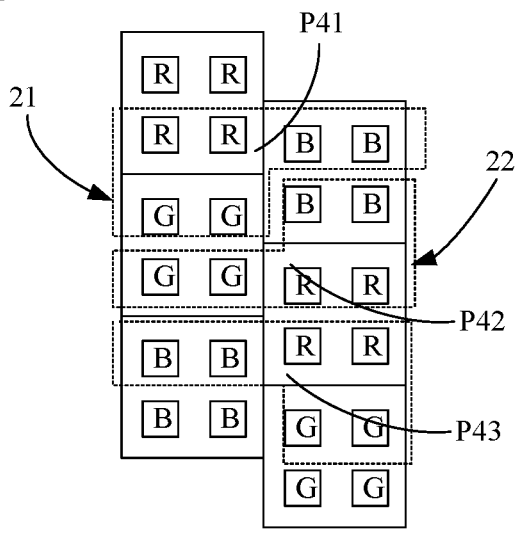
FIG. 4E is another schematic diagram showing a division of pixel units according to specific embodiments of the present disclosure.

For another example, please refer to FIG. 4E, in an embodiment of the present disclosure, two R sub-pixels (e.g., two R sub-pixels of the second row of the first pixel sub-group 21 in FIG. 4E) and two G sub-pixels (e.g., two G sub-pixels of the third row of the first pixel sub-group 21 in FIG. 4E) of the first pixel sub-group 21, and two B sub-pixels of the second sub-pixel group 22 (e.g., two B sub-pixels of the first row of the second sub-pixel group 22 in FIG. 4E), in each pixel group 20, are divided into a pixel unit P41. In each pixel group 20, another two G sub-pixels of the first pixel sub-group 21 (e.g., two G sub-pixels of the fourth row of the first pixel sub-group 21 in FIG. 4E), two B sub-pixels of the second sub-pixel group 22 (e.g., two B sub-pixels of the second row of the second sub-pixel group 22 in FIG. 4E), and two R sub-pixels of the second sub-pixel group 22 (e.g., two R sub-pixels of the third row of the second sub-pixel group 22 in FIG. 4E) are divided into a pixel unit P42. In each pixel group 20, another two B sub-pixels of the first pixel sub-group 21 (e.g., two B sub-pixels of the fifth row of the first pixel sub-group 21 in FIG. 4E), another two R sub-pixels of the second sub-pixel group 22 (e.g., two R sub-pixels of the fourth row of the second pixel sub-group 22 in FIG. 4E), and two G sub-pixels of the second sub-pixel group 22 (e.g., two G sub-pixels of the fifth row of the second sub-pixel group 22 in FIG. 4E) are divided into a pixel unit P43. Each pixel unit formed by such division manner includes two R sub-pixels, two B sub-pixels, and two G sub-pixels, enabling the achievement of panchromatic display and being able to be used in 2D display mode. Moreover, since the number of pixel units is more than the number of pixel units shown in FIG. 4A, the display effect is further improved. In addition, by using time-sharing control, pixel units like P41 (the pixel units including four sub-pixels in the first sub-pixel group 21) separated from the pixel structure are able to be used for left eye display, and pixel units like P42 and P43 (the pixel units including two sub-pixels in the second sub-pixel group 22) separated from the pixel structures are able to be used for right eye display, thereby enabling the pixel structure to be applied to the VR and 3D display technologies.

Figure 4F:
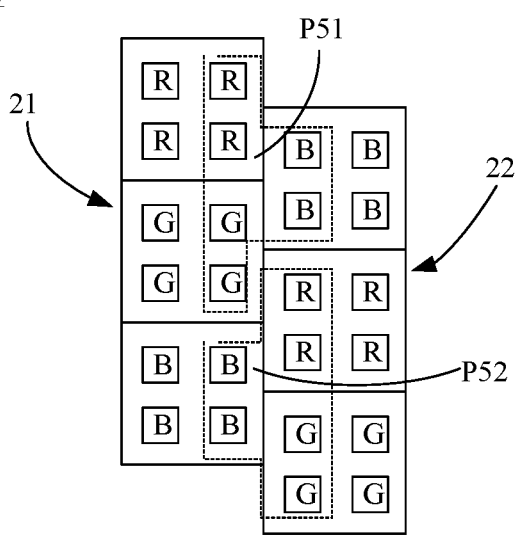
FIG. 4F is another schematic diagram showing a division of pixel units according to specific embodiments of the present disclosure.

For another example, please refer to FIG. 4F, in each pixel group 20, two R sub-pixels and two G sub-pixels in the right column of the first pixel sub-group 21 and two B sub-pixels in the left column of the second pixel sub-group 22 are divided into a pixel unit P51; and two B sub-pixels in the right column of the first pixel sub-group 21, and two R sub-pixels and two G sub-pixels in the left column of the second pixel sub-group 22 are divided into a pixel unit P52. Under such division manner of the pixel units, each pixel unit includes two R sub-pixels, two G sub-pixels, and two B sub-pixels, enabling the achievement of the panchromatic display and thus being able to be used in 2D display mode. Moreover, since the number of pixel units is more than the number of pixel units shown in FIG. 4A, the display effect is further improved.

Figure 4G:
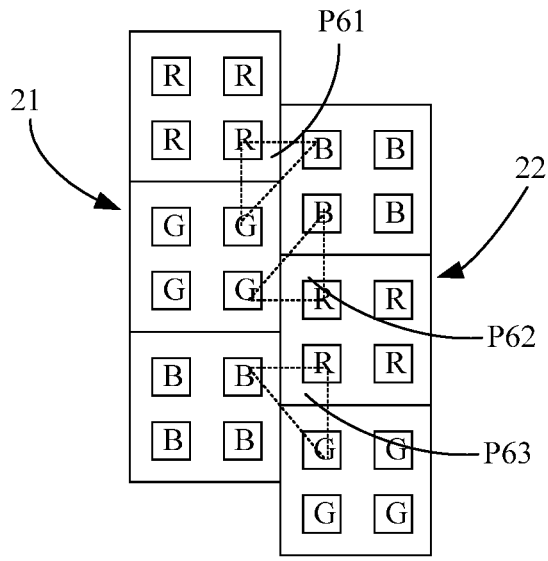
FIG. 4G is another schematic diagram showing a division of pixel units according to specific embodiments of the present disclosure.

Please Refer to FIG. 4G, in an embodiment of the present disclosure, in each pixel group 20, one R sub-pixel (e.g., the right R sub-pixel of the second row of the first pixel sub-group 21 in FIG. 4G) and one G sub-pixel (e.g., the right G sub-pixel of the third row of the first pixel sub-group 21 in FIG. 4G) of the right column of the first pixel sub-group 21, and one B sub-pixel of the left column of the second pixel sub-group 22 (e.g., the left B sub-pixel of the first row of the second pixel sub-group 22 in FIG. 4G) are divided into a pixel unit P61. In each pixel group 20, another G sub-pixel of the right column of the first pixel sub-group 21 (e.g., the right G sub-pixel of the fourth row of the first pixel sub-group 21 in FIG. 4G), and another B sub-pixel (e.g., the left B sub-pixel of the second row of the second pixel sub-group 22 in FIG. 4G) and one R sub-pixel (e.g., the left R sub-pixel of the third row of the second pixel sub-group 22 in FIG. 4G) of the left column in the second pixel sub-group 22 are divided into a pixel unit P62. In each pixel group 20, one B sub-pixel of the right column of the first pixel sub-group 21 (e.g., the right R sub-pixel of the fifth row of the first pixel sub-group 21 in FIG. 4G), and another R sub-pixel (e.g., the left R sub-pixel of the fourth row of the second pixel sub-group 22 in FIG. 4G) and one G sub-pixel (e.g., the left G sub-pixel of the fifth row of the second pixel sub-group 22 in FIG. 4G) of the left column in the second pixel sub-group 22 are divided into a pixel unit P63. Under such division manner of the pixel units, each pixel unit includes one R sub-pixel, one G sub-pixel, and one B sub-pixel, enabling the achievement of the panchromatic display and thus being able to be used in 2D display mode. Moreover, since the number of pixel units is more than the number of pixel units shown in FIG. 4A to FIG. 4E, the display effect is further improved.

Figure 4H:
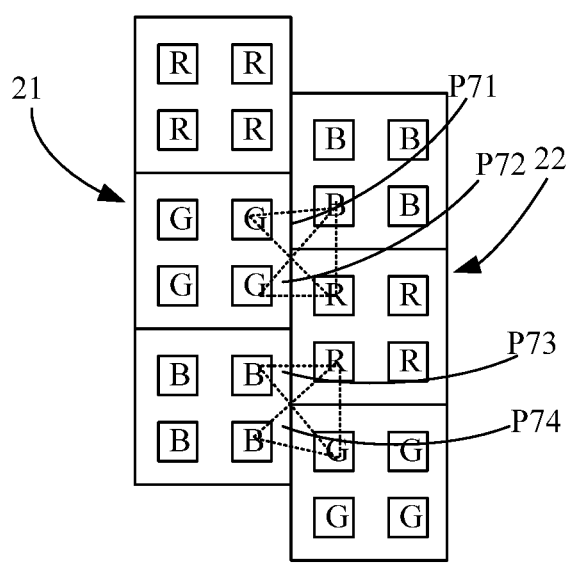
FIG. 4H is another schematic diagram showing a division of pixel units according to specific embodiments of the present disclosure.

In each of the above embodiments, the case that the sub-pixel is shared does not exist in each pixel group 20, that is, the case that two pixel units share a same sub-pixel does not exist. In other embodiments of the present disclosure, in the same pixel group 20, at least one sub-pixel is shared to form a corresponding pixel unit. For example, referring to FIG. 4H, in each pixel group 20, two G sub-pixels of the right column of the first pixel sub-group 21 share the adjacent B and R sub-pixels of the left column of the second pixel sub-group 22, thereby forming two pixel units P71 and P72; and two B sub-pixels of the right column of the first pixel sub-group 21 also share the adjacent G and R sub-pixels of the left column of the second pixel sub-group 22, thereby forming two pixel units P73 and P74. Under such division manner of the pixel units, each pixel unit includes sub-pixels of three colors of R, B and G, enabling the achievement of the panchromatic display can be achieved and being able to be used in 2D display mode. Moreover, since the number of pixel units is more than the number of pixel units shown in FIG. 4A to FIG. 4G, the display effect is further improved.

It should be noted that the display of each pixel unit is a result of mixing the content (color, brightness, etc.) displayed by driving each sub-pixel, and thus the display of each pixel unit not only relates to the type and number of sub-pixels constituting the pixel unit, but also relates to the combination form of the sub-pixels constituting the pixel unit. The driving signals required for the sub-pixels of different combination forms to form the pixel unit are also different. That is to say, after the pixel structure is divided into a plurality of pixel units, the sub-pixels are provided with driving signals according to the content that each pixel unit needs to display, so as to allocate corresponding brightness to the pixel units, and the pixel sharing manner is able to achieve a best mixed-color effect, thereby achieving a best display effect and further improving the resolution. Certainly, the above is only a specific sub-pixel sharing manner, and it is also feasible to adopt other sharing manners.

The present disclosure also provides a display device, including above pixel structures. The display device may be any product or component having a display function such as an OLED panel, a mobile phone, a tablet computer, a television, a display, a notebook computer, a digital photo frame, and a navigator, etc. Since the display device of the present disclosure includes the above pixel structures, the display device has high display uniformity and good display quality.

It can be understood that the above embodiments are merely exemplary embodiments adopted to explain the principles of the present disclosure, but the present disclosure is not limited thereto. Various modifications and improvements can be made by persons of ordinary skills in the art without departing from the spirit and substance of the present disclosure, and such modifications and improvements are also considered as the protection scope of the present disclosure.

What is claimed is:

1. A pixel structure, comprising a plurality of pixel groups arranged in an array, each of the pixel groups comprising a first pixel sub-group and a second pixel sub-group disposed adjacent to each other and misaligned with each other, each of the first pixel sub-group and the second pixel sub-group comprising sub-pixel groups of three different colors comprising a first sub-pixel group, a second sub-pixel group, and a third sub-pixel group, each of the sub-pixel groups comprising four sub-pixels of a same color,
wherein each of the pixel groups is divided into at least one pixel unit, and each pixel unit comprises sub-pixels of three different colors,
wherein in a same pixel group, at least one sub-pixel in the first pixel sub-group and/or the second pixel sub-group is shared to form a corresponding pixel unit.

2. The pixel structure according to claim 1, wherein in each of the pixel groups, the first pixel sub-group and the second pixel sub-group are disposed adjacent to each other in a first direction and are misaligned with each other in a second direction perpendicular to the first direction.

3. The pixel structure according to claim 2, wherein the first direction is a row direction, and the second direction is a column direction; or
the first direction is a column direction, and the second direction is a row direction.

4. The pixel structure according to claim 3, wherein in each of the pixel groups, the sub-pixel groups of three different colors in the first pixel sub-group and the second pixel sub-group are repeatedly arranged in the second direction in a same order.

5. The pixel structure according to claim 3, wherein in each of the pixel groups, the sub-pixel groups of three different colors in the first pixel sub-group and the second pixel sub-group are repeatedly arranged in the second direction in a different order.

6. The pixel structure according to claim 3, wherein the four sub-pixels of a same color in each of the sub-pixel groups are arranged in an array of two rows and two columns in the first direction and the second direction.

7. The pixel structure according to claim 6, wherein the four sub-pixels of a same color in each of the sub-pixel groups have same shapes and same sizes; and when a height of the second pixel sub-group in the second direction is lower than a height of the first pixel sub-group in the second direction, in a same pixel group, a center line of a sub-pixel group of a first color in the second pixel sub-group along the second direction coincides with a boundary line between a sub-pixel group of a second color and a sub-pixel group of a third color in the first pixel sub-group.

8. The pixel structure according to claim 6, wherein the four sub-pixels of a same color in each of the sub-pixel groups have same shapes and sizes; and when a height of the second pixel sub-group in the second direction is higher than a height of the first pixel sub-group in the second direction, in a same pixel group, a center line of a sub-pixel group of a first color in the first pixel sub-group along the second direction coincides with a boundary line between a sub-pixel group of a second color and a sub-pixel group of a third color in the second pixel sub-group.

9. The pixel structure according to claim 1, wherein in a same pixel group, no sub-pixel is shared in the first pixel sub-group and the second pixel sub-group.

10. The pixel structure according to claim 1, wherein in the pixel unit, some of the pixel unit is used for achieving left eye display, and the other of the pixel unit is used for achieving right eye display.

11. A mask for manufacturing the pixel structure according to claim 1.

12. The mask according to claim 11, having a plurality of evaporation openings, each of the evaporation openings corresponding to at least two sub-pixels of a same color.

13. The pixel structure according to claim 1, wherein the three colors are red, green and blue.

14. The pixel structure according to claim 1, wherein in each of the pixel groups, a shape and size of each sub-pixel are same.

15. The pixel structure according to claim 14, wherein each sub-pixel is of a strip-shape.

16. The mask according to claim 11, wherein evaporation openings of the mask are arranged in a staggered manner.

17. A pixel structure, comprising a plurality of pixel groups arranged in an array, each of the pixel groups comprising a first pixel sub-group and a second pixel sub-group disposed adjacent to each other and misaligned with each other, each of the first pixel sub-group and the second pixel sub-group comprising sub-pixel groups of three different colors comprising a first sub-pixel group, a second sub-pixel group, and a third sub-pixel group, each of the sub-pixel groups comprising four sub-pixels of a same color,
  wherein each of the pixel groups is divided into at least one pixel unit, and each pixel unit comprises sub-pixels of three different colors,
  wherein in the pixel unit, some of the pixel unit is used for achieving left eye display, and the other of the pixel unit is used for achieving right eye display.

* * * * *